(12) United States Patent
Nojiri

(10) Patent No.: US 10,347,334 B2
(45) Date of Patent: Jul. 9, 2019

(54) VARIABLE RESISTANCE MEMORY

(71) Applicant: Toshiba Memory Corporation, Minato-ku (JP)

(72) Inventor: Yasuhiro Nojiri, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/848,416

(22) Filed: Dec. 20, 2017

(65) Prior Publication Data

US 2018/0277207 A1 Sep. 27, 2018

(30) Foreign Application Priority Data

Mar. 24, 2017 (JP) ................. 2017-059856

(51) Int. Cl.
*G11C 13/00* (2006.01)
*H01L 27/24* (2006.01)
*H01L 45/00* (2006.01)
*G11C 17/16* (2006.01)

(52) U.S. Cl.
CPC ........ *G11C 13/0038* (2013.01); *G11C 13/003* (2013.01); *G11C 13/0023* (2013.01); *G11C 13/0064* (2013.01); *G11C 13/0069* (2013.01); *G11C 17/165* (2013.01); *H01L 27/24* (2013.01); *H01L 45/04* (2013.01); *H01L 45/1233* (2013.01); *H01L 45/1253* (2013.01); *G11C 2013/009* (2013.01); *G11C 2013/0083* (2013.01); *G11C 2213/15* (2013.01); *G11C 2213/72* (2013.01); *G11C 2213/75* (2013.01)

(58) Field of Classification Search
CPC ........................ G11C 11/1675; G11C 13/0069

USPC .................................................. 365/148, 158
See application file for complete search history.

(56) References Cited

U.S. PATENT DOCUMENTS

| | | | | |
|---|---|---|---|---|
| 6,087,674 A | * | 7/2000 | Ovshinsky | G11C 13/0004 257/2 |
| 6,473,332 B1 | * | 10/2002 | Ignatiev | G11C 11/5685 365/148 |
| 9,589,636 B1 | * | 3/2017 | Bhavnagarwala | G11C 13/0002 |
| 2007/0246832 A1 | | 10/2007 | Odagawa et al. | |
| 2010/0054014 A1 | | 3/2010 | Lee et al. | |
| 2010/0181546 A1 | * | 7/2010 | Yamamoto | H01L 45/12 257/2 |
| 2010/0213433 A1 | | 8/2010 | Yamamoto et al. | |

(Continued)

FOREIGN PATENT DOCUMENTS

| | | |
|---|---|---|
| JP | 2010-135527 | 6/2010 |
| JP | 2010-192800 | 9/2010 |

(Continued)

*Primary Examiner* — Michael T Tran
(74) *Attorney, Agent, or Firm* — Oblon, McClelland, Maier & Neustadt, L.L.P.

(57) ABSTRACT

A semiconductor device according to an embodiment includes a memory cell array and a drive circuit section. The memory cell array includes memory cells. The drive circuit section adapted to control a driving voltage to be supplied to the memory cells. The memory cells each including a first variable resistance film and a second variable resistance film connected in series to the first variable resistance film. The driving voltage of the second variable resistance film is different from the driving voltage of the first variable resistance film.

19 Claims, 10 Drawing Sheets

(56) References Cited

U.S. PATENT DOCUMENTS

| | | | | |
|---|---|---|---|---|
| 2010/0219392 A1* | 9/2010 | Awaya | ................ | H01L 27/0688 257/3 |
| 2011/0031463 A1* | 2/2011 | Sato | ........................ | H01L 45/12 257/4 |
| 2011/0205781 A1* | 8/2011 | Nakai | .................... | G11C 14/00 365/148 |
| 2011/0280064 A1* | 11/2011 | Noshiro | .............. | G11C 11/5678 365/158 |
| 2011/0306199 A1* | 12/2011 | Nojiri | .................... | B82Y 10/00 438/618 |
| 2012/0008369 A1 | 1/2012 | Shimuta et al. | | |
| 2012/0069628 A1* | 3/2012 | Ito | ...................... | G11C 13/0002 365/148 |
| 2012/0217461 A1* | 8/2012 | Kobayashi | .............. | H01L 45/08 257/2 |
| 2012/0217464 A1* | 8/2012 | Kobayashi | .............. | H01L 45/04 257/4 |
| 2012/0257437 A1* | 10/2012 | Seko | ................... | G11C 11/5678 365/148 |
| 2013/0010530 A1* | 1/2013 | Katayama | .......... | G11C 13/0007 365/148 |
| 2013/0076551 A1* | 3/2013 | Marukame | .......... | H03M 1/1061 341/159 |
| 2013/0223127 A1* | 8/2013 | Park | ....................... | G11C 13/00 365/148 |
| 2013/0228737 A1* | 9/2013 | Fukumizu | ............... | H01L 45/08 257/4 |
| 2013/0235646 A1* | 9/2013 | Nojiri | ................ | G11C 13/0002 365/148 |
| 2014/0104925 A1* | 4/2014 | Azuma | ................ | G11C 13/004 365/148 |
| 2014/0347911 A1* | 11/2014 | Minemura | ......... | G11C 13/0002 365/148 |
| 2015/0103581 A1* | 4/2015 | Murooka | ........... | G11C 13/0033 365/148 |
| 2015/0340092 A1* | 11/2015 | Ogasahara | ........... | G11C 13/004 711/105 |
| 2015/0340606 A1* | 11/2015 | Tada | .................. | G11C 13/0002 257/4 |
| 2016/0300614 A1* | 10/2016 | Nebashi | ................. | G11C 15/02 |
| 2016/0322102 A1* | 11/2016 | Sasaki | ................ | G11C 13/0069 |
| 2017/0256312 A1* | 9/2017 | Sugimae | .............. | H01L 45/1675 |
| 2017/0263681 A1* | 9/2017 | Toriyama | .......... | H01L 27/249 |
| 2017/0263682 A1* | 9/2017 | Komura | ................ | H01L 23/528 |
| 2018/0061890 A1* | 3/2018 | Tada | ..................... | H01L 27/105 |

FOREIGN PATENT DOCUMENTS

| | | |
|---|---|---|
| JP | 2012-18964 | 1/2012 |
| JP | 4857014 | 1/2012 |

* cited by examiner

VARIABLE RESISTANCE MEMORY

CROSS-REFERENCE TO RELATED APPLICATIONS

This application is based upon and claims the benefit of priority from Japanese Patent Application No. 2017-059856, filed on Mar. 24, 2017; the entire contents of which are incorporated herein by reference.

FIELD

Embodiments described herein relate generally to a variable resistance memory.

BACKGROUND

Variable resistance memories are desired to be provided with an extended life.

DETAILED DESCRIPTION

A semiconductor device according to an embodiment includes a memory cell array and a drive circuit section. The memory cell array includes memory cells. The drive circuit section adapted to control a driving voltage to be supplied to the memory cells. The memory cells each including a first variable resistance film and a second variable resistance film connected in series to the first variable resistance film. The driving voltage of the second variable resistance film is different from the driving voltage of the first variable resistance film.

(First Embodiment)

A first embodiment of the invention will hereinafter be described with reference to the drawings.

The drawings are schematic or conceptual ones, and the relationship between the thickness and the width of each of the constituents, the dimensional ratio between the constituents, and so on are not necessarily the same as real ones. Even in the case of expressing the same constituents, the dimensions of the constituents and the ratios between the constituents are differently expressed by the drawings in some cases.

In the specification and the drawings of the patent application, substantially the same constituents as those having already been described with respect to the drawings having already been mentioned will be denoted by the same reference symbols, and the detailed description thereof will arbitrarily be omitted.

Figure 1:
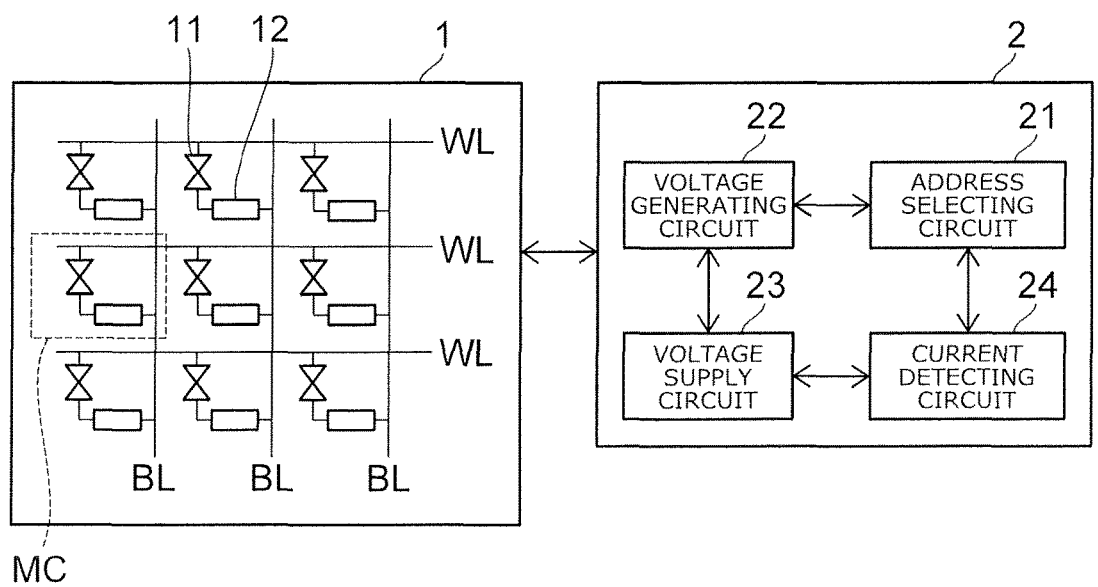
FIG. 1 is a schematic block diagram illustrating a variable resistance memory according to the first embodiment.

FIG. 1 is a schematic block diagram illustrating a variable resistance memory according to the first embodiment.

As shown in FIG. 1, the variable resistance memory is provided with a memory cell array 1 and a drive circuit section 2. The memory cell array 1 includes memory cells MC. The drive circuit section 2 controls a driving voltage to be applied to the memory cells MC.

The drive circuit section 2 includes an address selecting circuit 21, a voltage generating circuit 22, a voltage supply circuit 23, and a current detecting circuit 24. The address selecting circuit 21 selects the address of the memory cell MC in the memory cell array 1 when reading out information (in a reading operation) and when writing information (in a writing operation). The voltage generating circuit 22 generates voltages, which are necessary for the reading operation and the writing operation, and are supplied to the memory cells MC. The voltage supply circuit 23 provides the voltages generated by the voltage generating circuit 22 to the memory cell MC selected by the address selecting circuit 21. The current detecting circuit 24 detects the current having flown through the memory cell MC selected in the reading operation, and a verify read in the writing operation.

The memory cells MC are connected between word lines WL and bit lines BL, respectively. The memory cells MC each include a rectifying element 11 and a variable resistance section 12. The rectifying element 11 and the variable resistance section 12 are connected in series to each other between the word line WL and the bit line BL.

Figure 2:
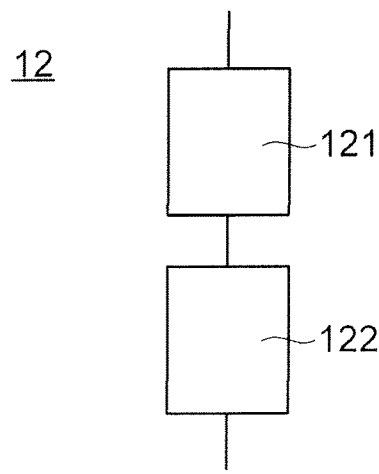
FIG. 2 is a schematic view illustrating the variable resistance section.
Figure 3:
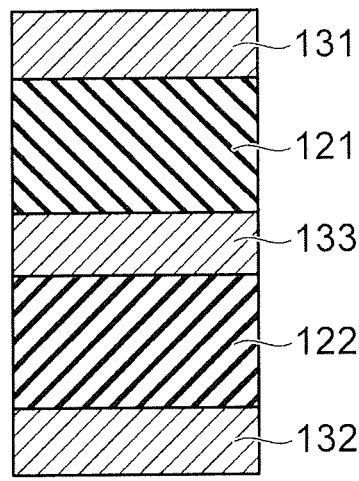
FIG. 3 is a schematic cross-sectional view illustrating the variable resistance section.

FIG. 2 is a schematic view illustrating the variable resistance section 12. FIG. 3 is a schematic cross-sectional view illustrating the variable resistance section 12.

As shown in FIG. 2 and FIG. 3, the variable resistance section 12 includes a first variable resistance film 121 and a second variable resistance film 122. The second variable resistance film 122 is connected in series to the first variable resistance film 121. Further, the variable resistance film 12 includes, for example, a first electrode, a second electrode, and an intermediate electrode 133. At the embodiment, the first electrode is an upper-part electrode 131, and the second electrode is a lower-part electrode 132. Note that the first electrode may be the lower-part electrode 132 and the second electrode may be the upper-part electrode 131. The intermediate electrode 133 is provided between the upper-part electrode 131 and the lower-part electrode 132. The first variable resistance film 121 is provided between the upper-part electrode 131 and the intermediate electrode 133. The second variable resistance film 122 is provided between the intermediate electrode 133 and the lower-part electrode 132. Note that the first variable resistance film 121 may be provided between the intermediate electrode 133 and the lower-part electrode 132 and the second variable resistance film 122 may be provided between the upper-part electrode 131 and the intermediate electrode 133.

Figure 4:
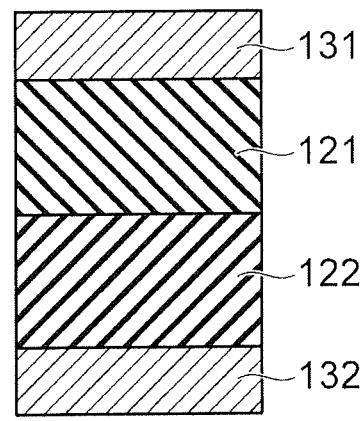
FIG. 4 is a schematic cross-sectional view illustrating another variable resistance section.

FIG. 4 is a schematic cross-sectional view illustrating another variable resistance section 12a.

As shown in FIG. 4, the variable resistance section 12a lacks, for example, the intermediate electrode 133 compared to the variable resistance section 12. The first variable resistance film 121 is provided between the upper-part electrode 131 and the lower-part electrode 132. The second variable resistance film 122 is provided between the first variable resistance film 121 and the lower-part electrode 132. Note that the first variable resistance film 121 may be provided between the second variable resistance film 122 and the lower-part electrode 132. As described above, the intermediate electrode 133 can be eliminated. It should be noted that if the intermediate electrode 133 is provided, the first variable resistance film 121 and the second variable resistance film 122 are separated from each other by the intermediate electrode 133. It is possible for the intermediate electrode 133 to prevent the contained component from moving between, for example, the first variable resistance film 121 and the second variable resistance film 122. Therefore, it is possible to obtain an advantage that, for example, the deterioration with time of the first variable resistance film 121 and the second variable resistance film 122 can be prevented.

Figure 5:
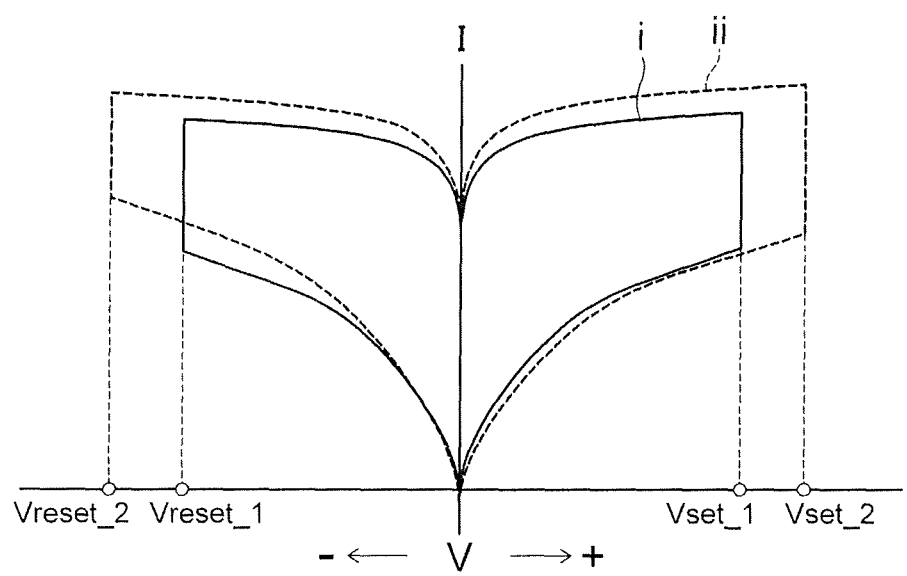
FIG. 5 is a diagram showing the current-voltage characteristics of the first variable resistance film and the second variable resistance film.

FIG. 5 is a diagram showing the current (I)-voltage (V) characteristics of the first variable resistance film 121 and the second variable resistance film 122. The I-V characteristics shown in FIG. 5 correspond to the case in which the variable resistance section 12 performs a "bipolar operation."

As shown in FIG. 5, set and reset voltages of the second variable resistance film 122 is different from set and reset voltages of the first variable resistance film 121. In the specification, for example, a "high-resistance state" of the first variable resistance film 121 is defined as a reset state, and a "low-resistance state" is defined as a set state. In FIG. 5, the I-V characteristics of the first variable resistance film 121 is indicated by the solid line "i," and the I-V characteristics of the second variable resistance film 122 is indicated by the dotted line "ii."

If a first reset voltage Vreset_1 is supplied as an applied voltage to the first variable resistance film 121, the first variable resistance film 121 is set to the "high-resistance state (the reset state)," and if a first set voltage Vset_1 is supplied, the first variable resistance film 121 is set to the "low-resistance state (the set state)." If a second reset voltage Vreset_2 is supplied as an applied voltage to the second variable resistance film 122, the second variable resistance film 122 is set to the "high-resistance state (the reset state)," and if a second set voltage Vset_2 is supplied, the second variable resistance film 122 is set to the "low-resistance state (the set state)." The second reset voltage Vreset_2 is lower than the first reset voltage Vreset_1 (it should be noted that the second reset voltage Vreset_2 is higher in absolute value than the first reset voltage Vreset_1). The second set voltage Vset_2 is higher than the first set voltage Vset_1 (it should be noted that the second set voltage Vset_2 is higher in absolute value than the first set voltage Vset_1). When performing the bipolar operation, the second set voltage Vset_2 is not required to be higher than the first set voltage Vset_1. This is because if the first set voltage Vset_1 is supplied in order to make the first variable resistance film become in the set state in the case of "Vset_2<Vset_1," the second variable resistance film 122 is inevitably made to become in the set state. However, in this case, there is a possibility that an excessive current flows in the second variable resistance film 122. Therefore, when a set operation and a reset operation are repeated, the resistance after setting of the second variable resistance film 122 decreases, the set voltage changes, or the second variable resistance film 122 completely breaks down and does not reset. Therefore, also in the bipolar operation, the second set voltage Vset_2 may be higher than the first set voltage Vset_1 ("Vset_2>Vset_1"). The second variable resistance film 122 does not require a forming operation. Therefore, it is also possible to use, for example, a variable resistance film not requiring the forming operation as the second variable resistance film.

In the normal operation, the second variable resistance film 122 keeps the "low-resistance state (the set state)." In the normal operation, the first variable resistance film 121 stores the information in accordance with the value of the current flowing through the memory cell MC between the reset state and the set state. The set and reset voltages voltage of the second variable resistance film 122 is different from the set and reset voltages of the first variable resistance film 121. In the normal state, the drive circuit section 2 supplies the memory cell MC with a voltage in a range of the first set voltage Vset_1 through the first reset voltage Vreset_1 as the applied voltage. The absolute value of the second set voltage Vset_2 and the absolute value of the second reset voltage Vreset_2 are each high. For example, in a normal state, the "low-resistance state (the set state)" of the second variable resistance film 122 does not change.

In the normal state, if the set and reset voltages of the first variable resistance film 121 has varied, the variable resistance memory of the first embodiment judges that the first variable resistance film 121 "has had a trouble." The case in which the set and reset voltages of the first variable resistance film 121 has varied corresponds to, for example, the case in which the set state has not been achieved even if the drive circuit section 2 has supplied the memory cell MC with the first set voltage Vset_1, or the case in which the reset state has not been achieved even if the drive circuit section 2 has supplied the memory cell MC with the first reset voltage Vreset_1.

In the variable resistance memory of the first embodiment, in the case in which the first variable resistance film 121 "has had a trouble," the drive circuit section 2 supplies the memory cell MC with the second reset voltage Vreset_2. The second variable resistance film 122 makes the transition from the "low-resistance state (the set state)" to the "high-resistance state (the reset state)." Thus, the memory cell MC including the first variable resistance film 121, which "has had a trouble," is electrically separated from each of the bit line BL and the word line WL.

For example, memory cell MC including the first variable resistance film 121 having "the trouble which is a low-resistance state and not being reset" is electrically connected in series between the bit line BL and the word line WL. In this case, the bit line BL and the word line WL are short-circuited. This is a phenomenon called "progressive interconnection short circuit." As the number of the memory cells MC having the "progressive interconnection short circuit" increases in the memory cell array 1, it becomes difficult for the variable resistance memory to perform the normal operation.

According to the variable resistance memory related to the first embodiment, for example, regarding the memory cells MC having had the "progressive interconnection short circuit," the second variable resistance film 122 is set to the "high-resistance state (the reset state)." Thus, it is possible to electrically separate the memory cells MC having had the "progressive interconnection short circuit" from each of the bit line BL and the word line WL. It is possible for the variable resistance memory of the first embodiment to normally operate even in the case in which, for example, the number of the memory cells MC having had the "progressive interconnection short circuit" has increased.

As described above, according to the variable resistance memory of the first embodiment, it is possible to extend the life of the variable resistance memory. A specific example of the operation of the variable resistance memory of the first embodiment will hereinafter be described with respect to the case in which the variable resistance section 12 performs the "bipolar operation" and the case in which the variable resistance section 12 performs the "unipolar operation."

(1) Bipolar Operation: High Resistance Achieving Operation (Erasing Operation: Resetting Operation)

Figure 6:
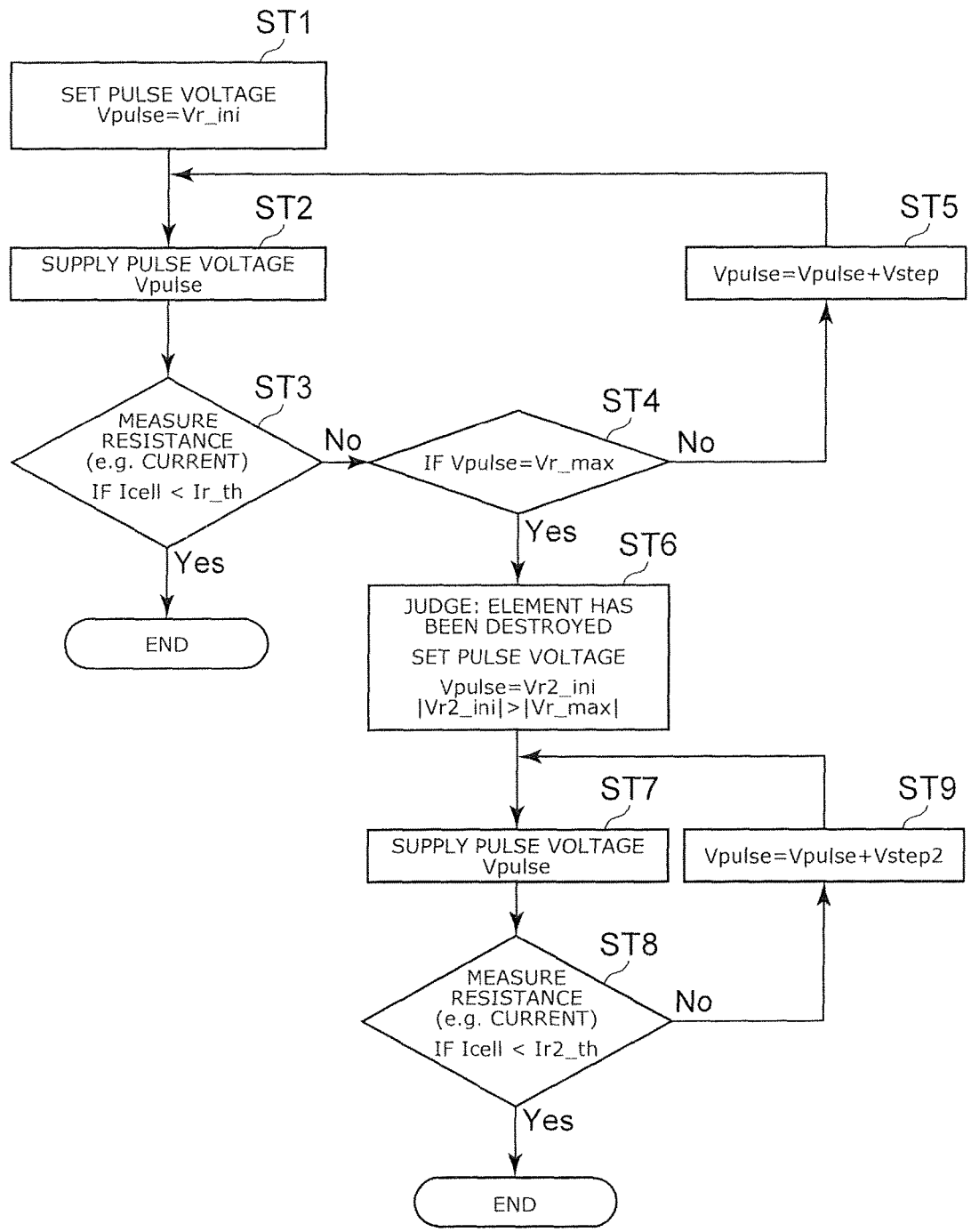
FIG. 6 is a flowchart illustrating the resetting operation of the variable resistance memory according to the first embodiment.
Figure 7:
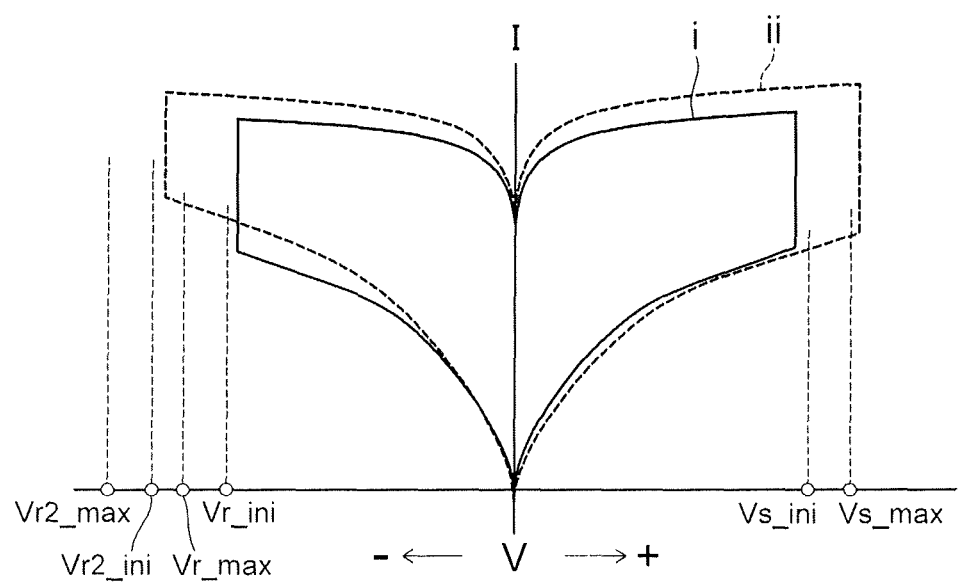
FIG. 7 is a diagram showing the current-voltage characteristics of the first variable resistance film and the second variable resistance film.

FIG. 6 is a flowchart illustrating the resetting operation of the variable resistance memory according to the first embodiment. FIG. 7 is a diagram showing the current (I)-voltage (V) characteristics of the first variable resistance film 121 and the second variable resistance film 122.

As shown in the step ST1 in FIG. 6, a pulse voltage Vpulse to be supplied to the memory cell MC selected is set. In the step ST1, for example, the voltage of the pulse voltage Vpulse is set to an initial reset voltage Vr_ini (Vpulse=Vr_ini).

Then, as shown in the step ST2 in FIG. 6, a pulse voltage Vpulse is supplied to the memory cell MC selected. The pulse voltage Vpulse is supplied to the memory cell MC selected via, for example, the word line WL.

Then, as shown in the step ST3 in FIG. 6, the resistance of the memory cell MC is measured. The resistance of the memory cell MC is measured by, for example, detecting the current Icell having flown through the memory cell MC selected with the current detecting circuit 24.

If the value of the current Icell having been detected is lower than the value of a reset current Ir_th (Yes), it is judged that the memory cell MC selected "has become in the high-resistance state (the reset state)." The resetting operation (the erasing operation) ends. The value of the reset current Ir_th is the value of a reference current representing the fact that the memory cell MC "has become in the high-resistance state (the reset state)." In the first embodiment, the value of the reset current Ir_th is the value of the reference current representing the fact that the resistance of the first variable resistance film 121 "has become in the high-resistance state (the reset state)."

If the value of the current Icell having been detected is not less than the value of the current Ir_th (No), it is judged that the memory cell MC selected "has not become in the high-resistance state (the reset state)." In this case, the resetting operation (the erasing operation) is repeated. For example, the process proceeds to the step ST4 in FIG. 6 to judge whether or not the voltage of the pulse voltage Vpulse is the maximum reset voltage Vr_max (Vpulse=Vr_max).

In the case in which it has been judged in the step ST4 that the voltage of the pulse voltage Vpulse is not the maximum reset voltage Vr_max (No), the process proceeds to the step ST5 to add a step-up voltage Vstep to the voltage of the pulse voltage Vpulse (Vpulse=Vpulse+Vstep). Then, as shown in the step ST2, the pulse voltage Vpulse added with the step-up voltage Vstep is supplied once again to the memory cell MC selected. Then, as shown in the step ST3, the resistance of the memory cell MC is measured. The operation of repeating the step ST2-step ST3-step ST4-step ST5-step ST2-step ST3- . . . corresponds to a verifying operation.

In the case in which it has been judged in the step ST4 that the voltage of the pulse voltage Vpulse is the maximum value Vr_max (Yes), the process proceeds to the step ST6. For example, in the step ST6, it is judged that the memory cell MC selected has been destroyed. This is the case in which, for example, the first variable resistance film 121 "has had a trouble." The operation makes the transition to the operation of electrically separating the memory cell MC selected from the word line WL and the bit line BL. The voltage of the pulse voltage Vpulse is set to a second initial value Vr2_ini (Vpulse=Vr2_ini). The second initial value Vr2_ini is a voltage for setting the second variable resistance film 122 to the "high-resistance state (the reset state)." As shown in FIG. 7, the absolute value of the second initial value Vr2_ini is higher than, for example, the absolute value of the maximum value Vr_max (|Vr2_ini|>|Vr_max|).

Then, as shown in the step ST7 in FIG. 6, the pulse voltage Vpulse is supplied to the memory cell MC selected.

Then, as shown in the step ST8 in FIG. 6, the resistance of the memory cell MC is measured. Similarly to the step ST3, the resistance of the memory cell MC is measured by, for example, detecting the current Icell having flown through the memory cell MC selected with the current detecting circuit 24.

In the case in which the value of the current Icell having been detected is not less than a second reset current Ir2_th (No), it is judged that the memory cell MC selected "has not become in the high-resistance state (the reset state)." In this case, the operation of electrically separating the memory cell MC selected from the word line WL and the bit line BL is repeated. For example, the process proceeds to the step ST9 in FIG. 6 to add a second step-up voltage Vstep2 to the voltage of the pulse voltage Vpulse (Vpulse=Vpulse+Vstep2). The value of the second reset current Ir2_th is the value of a reference current representing the fact that the resistance of the second variable resistance film 122 "has become in the high-resistance state (the reset state)." Then, as shown in the step ST7, the pulse voltage Vpulse added with the second step-up voltage Vstep2 is supplied once again to the memory cell MC selected.

If the value of the current Icell having been detected is lower than the value of the current Ir2_th (Yes), it is judged that the memory cell MC "has become in the high-resistance state (the reset state)." The operation of electrically separating the memory cell MC selected from the word line WL and the bit line BL ends.

(2) Bipolar Operation: Low Resistance Achieving Operation (Writing Operation: Setting Operation)

Figure 8:
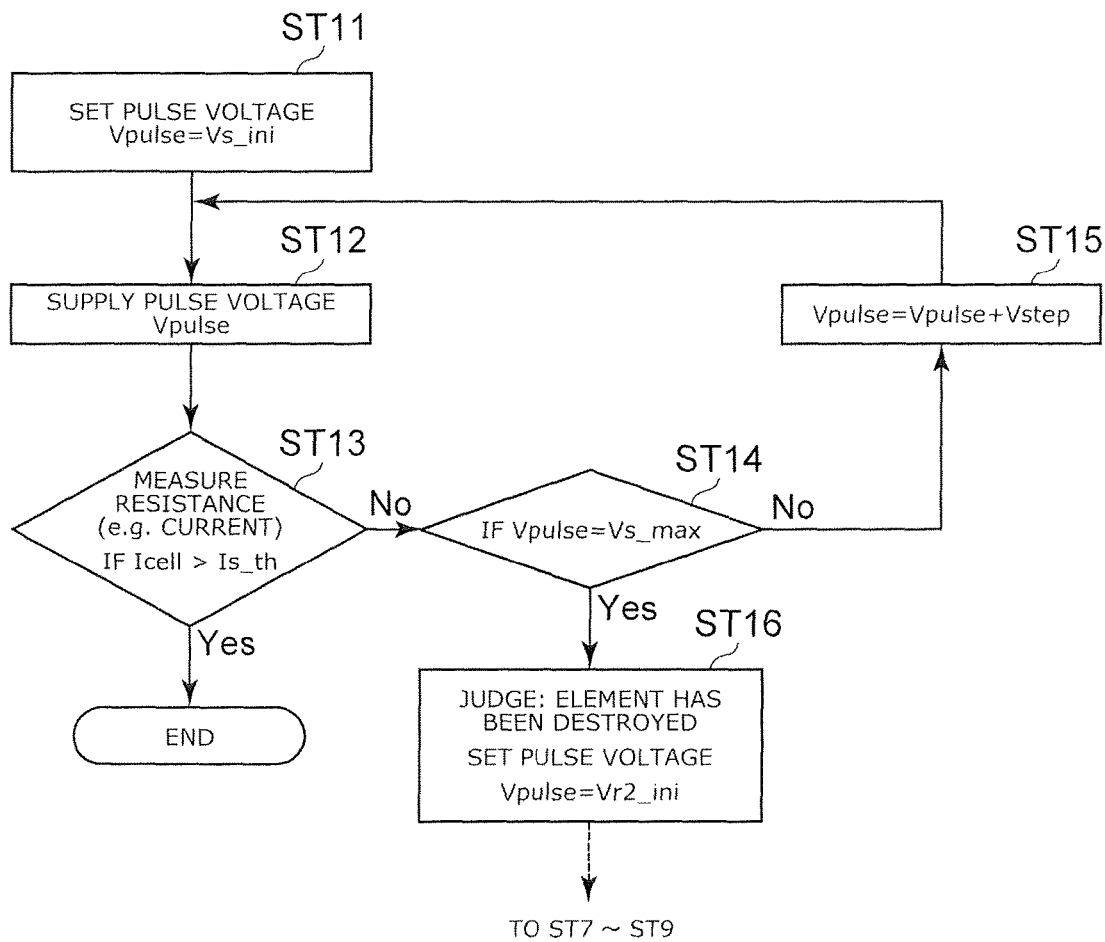
FIG. 8 is a flowchart illustrating the setting operation of the variable resistance memory according to the first embodiment.

FIG. 8 is a flowchart illustrating the setting operation of the variable resistance memory according to the first embodiment. It should be noted that in the bipolar operation, the polarity of the pulse voltage Vpulse in the low resistance achieving operation and the polarity of the step-up voltage Vstep in the low resistance achieving process are opposite to the polarities in the high resistance achieving operation, respectively.

As shown in the step ST11 in FIG. 8, the pulse voltage Vpulse to be supplied to the memory cell MC selected is set. For example, the voltage of the pulse voltage Vpulse is set to an initial value Vs_ini (Vpulse=Vs_ini).

Then, as shown in the step ST12 in FIG. 8, the pulse voltage Vpulse is supplied to the memory cell MC selected. The pulse voltage Vpulse is supplied to the memory cell MC selected via, for example, the word line WL.

Then, as shown in the step ST13 in FIG. 8, the resistance of the memory cell MC is measured. The resistance of the memory cell MC is measured by detecting the current Icell having flown through the memory cell MC selected with the current detecting circuit 24.

If the value of the current Icell having been detected is higher than the value of a set current Is_th (Yes), it is judged that the memory cell MC selected "has become in the low-resistance state (the set state)." The setting operation (the writing operation) ends. In the first embodiment, the value of the set current Is_th is the value of a reference current representing the fact that the resistance of the first variable resistance film 121 "has become in the low-resistance state (the set state)."

If the value of the current Icell having been detected is not more than the set current Is_th (No), it is judged that the memory cell MC selected "has not become in the low-resistance state (the set state)." In this case, the setting operation (the writing operation) is repeated. For example, the process proceeds to the step ST14 in FIG. 8 to judge whether or not the voltage of the pulse voltage Vpulse is the maximum set voltage Vs_max (Vpulse=Vs_max).

In the case in which it has been judged in the step ST14 that the voltage of the pulse voltage Vpulse is not the maximum set voltage Vs_max (No), the process proceeds to the step ST15 to add the step-up voltage Vstep to the voltage of the pulse voltage Vpulse (Vpulse=Vpulse+Vstep). Then, as shown in the step ST12, the pulse voltage Vpulse added with the step-up voltage Vstep is supplied once again to the memory cell MC selected. Then, as shown in the step ST13, the resistance of the memory cell MC is measured. The operation of repeating the step ST12-step ST13-step ST14-step ST15-step ST12-step ST13-... corresponds to the verifying operation.

In the case in which it has been judged in the step ST14 that the voltage of the pulse voltage Vpulse is the maximum set voltage Vs_max (Yes), the process proceeds to the step ST16. For example, in the step ST16, it is judged that the memory cell MC selected has been destroyed. This is the case in which, for example, the first variable resistance film 121 "has had a trouble." The operation makes the transition to the operation of electrically separating the memory cell MC selected from the word line WL and the bit line BL. The voltage of the pulse voltage Vpulse is set to the second initial value Vr2_ini described with reference to FIG. 6 (Vpulse=Vr2_ini). The second initial value Vr2_ini is the voltage for setting the second variable resistance film 122 to the "high-resistance state (the reset state)."

Subsequently, the process proceeds to the step ST7 described with reference to FIG. 6. The steps ST7 through ST9 are repeated if needed. It should be noted that the step ST14 through step ST15 can be executed, but are not necessarily required.

(3) Unipolar Operation: High Resistance Achieving Operation (Erasing Operation: Resetting Operation)

Figure 9:
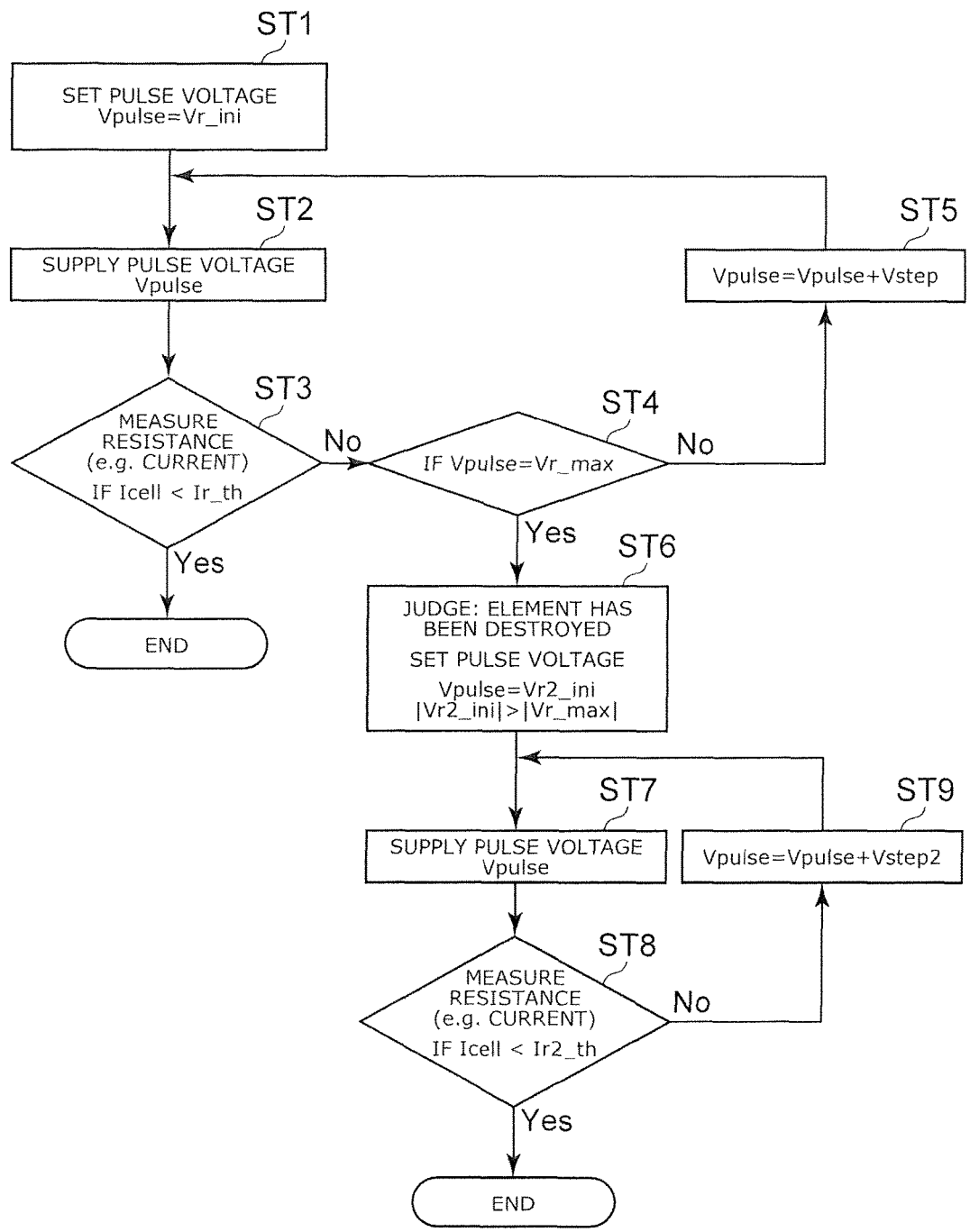
FIG. 9 is a flowchart illustrating the resetting operation of the variable resistance memory according to the first embodiment.
Figure 10:
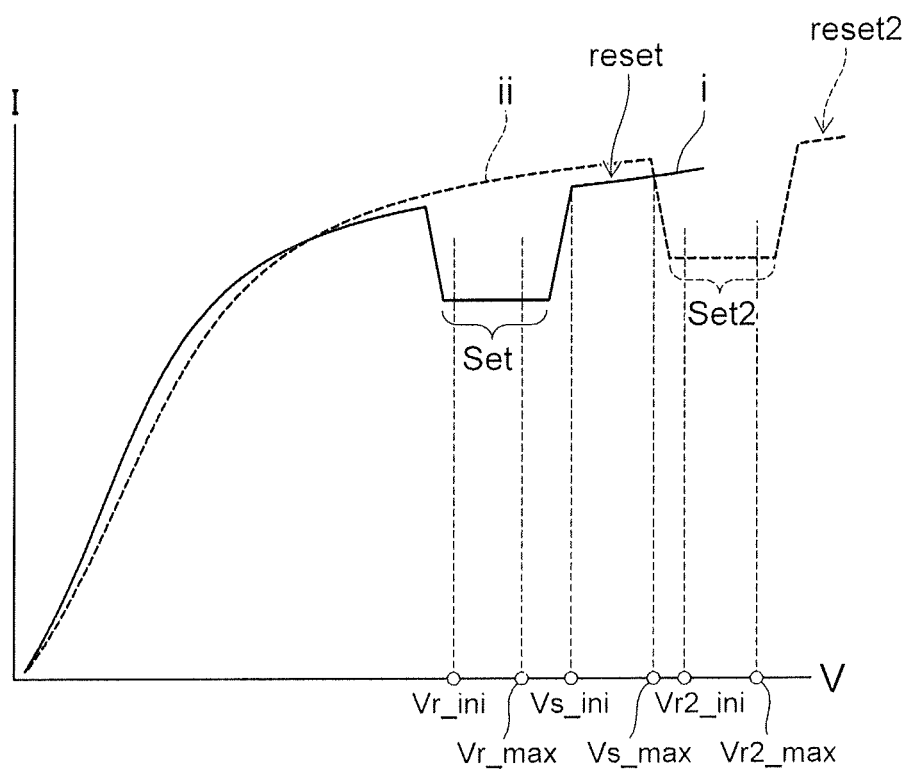
FIG. 10 is a diagram showing the current-voltage characteristics of the first variable resistance film and the second variable resistance film.

FIG. 9 is a flowchart illustrating the resetting operation of the variable resistance memory according to the first embodiment. FIG. 10 is a diagram showing the current (I)-voltage (V) characteristics of the first variable resistance film 121 and the second variable resistance film 122.

As shown in FIG. 9 and FIG. 10, in the case in which the memory cells MC perform the unipolar operation, the high resistance achieving operation is substantially the same as in the case of performing the bipolar operation. The difference is that, for example, the set state Set and the reset state reset of the first variable resistance film 121 and the set state Set2 and the reset state reset2 of the second variable resistance film 122 are different from each other as shown in FIG. 10. The reset state reset2 of the second variable resistance film 122 is higher than the reset state reset of the first variable resistance film 121, and the reset state reset2 of the second variable resistance film 122 and the reset state reset of the first variable resistance film 121 do not overlap each other.

(4) Unipolar Operation: Low Resistance Achieving Operation (Writing Operation: Setting Operation)

Figure 11:
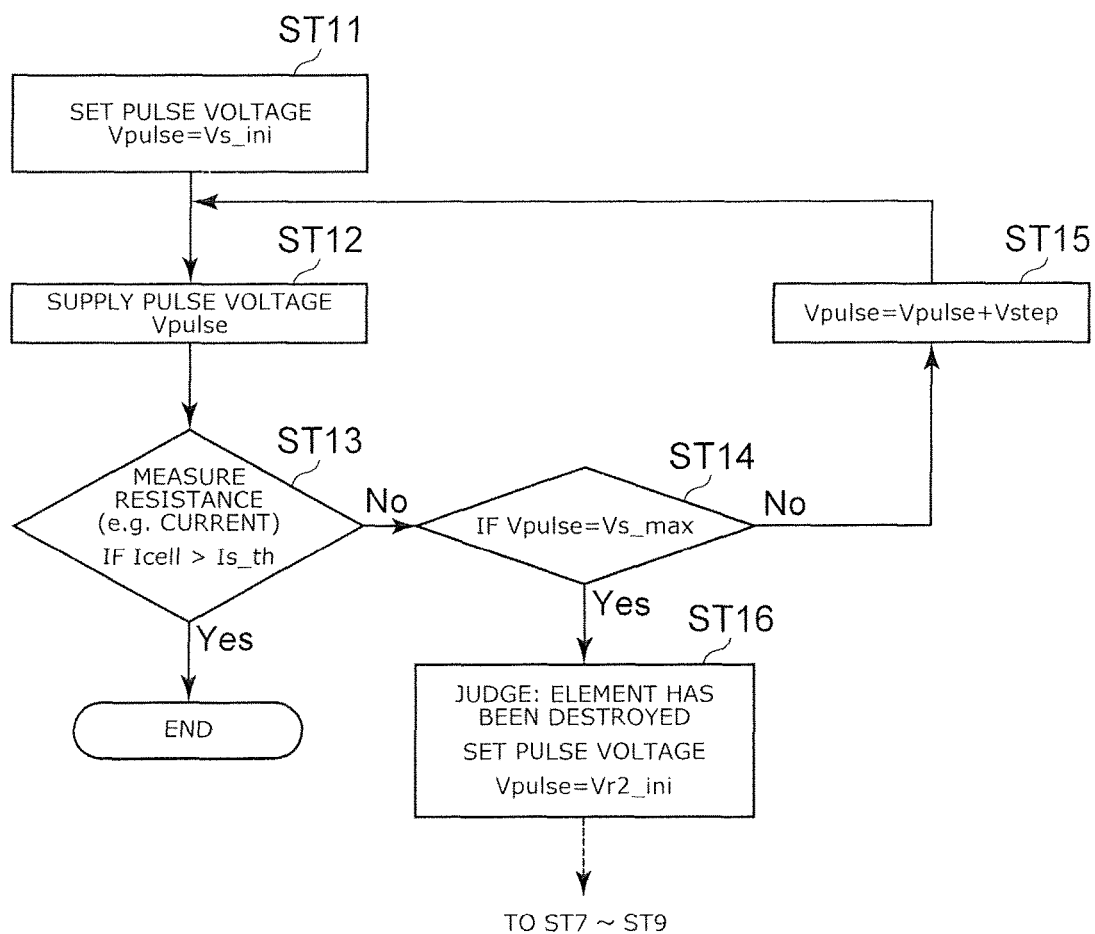
FIG. 11 is a flowchart illustrating the setting operation of the variable resistance memory according to the first embodiment.

FIG. 11 is a flowchart illustrating the setting operation of the variable resistance memory according to the first embodiment.

As shown in FIG. 11, in the case in which the memory cells MC perform the unipolar operation, the low resistance achieving operation is substantially the same as in the case of performing the bipolar operation.

(Second Embodiment)

Figure 12:
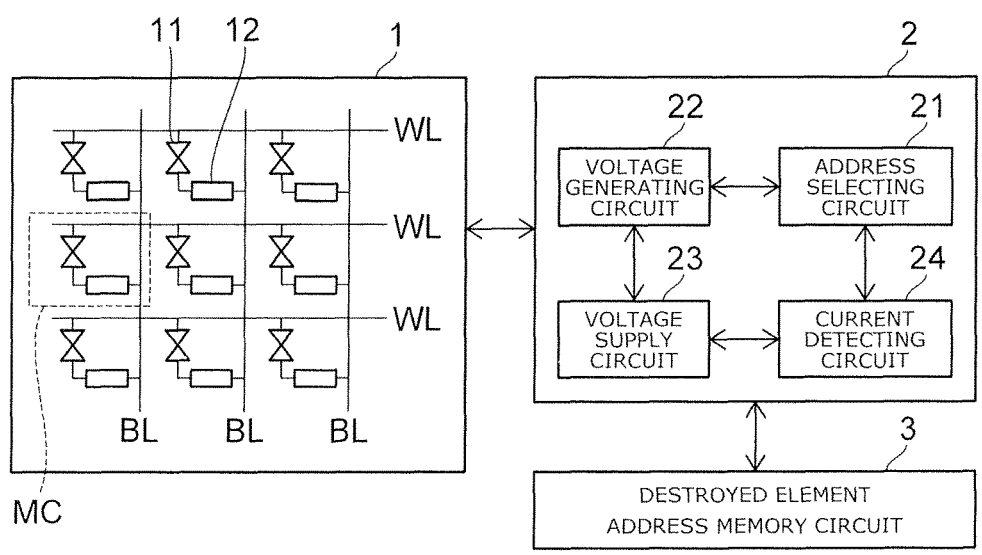
FIG. 12 is a schematic block diagram illustrating a variable resistance memory according to a second embodiment.

FIG. 12 is a schematic block diagram illustrating a variable resistance memory according to a second embodiment.

As shown in FIG. 12, the variable resistance memory according to the second embodiment is further provided with an address memory section 3 for storing the address of the memory cell MC. The address memory section 3 is provided with, for example, an address memory circuit, and the address memory circuit stores the address of the memory cell MC having increased the resistance of the second variable resistance film 122.

The drive circuit section 2 refrains from accessing the addresses stored in the address memory section 3, for example. Therefore, the variable resistance memory does not access destroyed ones of the memory cells MC. Thus, for example, when performing the writing operation, it is possible to prevent the writing error from occurring.

As in the second embodiment, it is also possible for the variable resistance memory to be further provided with the address memory section 3, make the address memory section 3 store the address of the destroyed one of the memory cells MC, and refrain from accessing the addresses stored.

Hereinabove, according to the embodiments, it is possible to provide the variable resistance memory capable of extending the life.

The first and second embodiments of the invention are hereinabove described with reference to the specific examples. However, the invention is not limited to these specific examples. For example, the memory cells MC are not limited to those described in the embodiments. The memory cells are only required to include the first variable resistance film 121, and the second variable resistance film 122, which is connected in series to the first variable resistance film, and is different in the set and reset voltages from the first variable resistance film.

Those obtained by combining any two or more elements in the specific examples with each other within a technically achievable range are also included in the scope of the invention as long as the subject matter of the invention is included.

Besides the above, all of the variable resistance memories, which can be implemented by those skilled in the art with arbitrary design changes based on the variable resistance memories described above as the first and second embodiments of the invention, belong to the scope of the invention as long as the subject matter of the invention is included.

Besides the above, those skilled in the art can conceive a variety of variations and modifications within the range of the concept of the invention, and it is acknowledged that such variations and modifications also belong to the scope of the invention.

Although the first and second embodiments of the invention are described, the first and second embodiments are illustrative only, but it is not intended to limit the scope of the invention. The novel first and second embodiments can be implemented with other various configurations, and a variety of omissions, replacements, and modifications can be made within the scope or the spirit of the invention. The first and second embodiments and the modifications thereof are included in the scope of the invention, and at the same time included in the invention set forth in the appended claims and the equivalents thereof.

Further, the invention is not limited to these examples. For example, the specific configurations of the elements such as the first memory cell, the second memory cell, the first word line, the first bit line, the second bit line, the source line and the row control circuit are included in the scope of the invention as long as it is possible for those skilled in the art to similarly implement the invention and obtain similar advantages by arbitrarily selecting such configurations from a range known to the public.

Those obtained by combining any two or more elements in the examples with each other within a technically achievable range are also included in the scope of the invention as long as the subject matter of the invention is included.

All of the semiconductor devices, which can be implemented by those skilled in the art with arbitrary design changes based on the semiconductor devices described above as the embodiments of the invention, belong to the scope of the invention as long as the subject matter of the invention is included.

Those skilled in the art can conceive a variety of variations and modifications within the range of the concept of the invention, and it is acknowledged that such variations and modifications also belong to the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A variable resistance memory, comprising:
   a memory cell array including memory cells;
   a drive circuit section adapted to control a driving voltage to be supplied to the memory cells;
   a word line; and
   a bit line,
   the memory cells each including
      a first variable resistance film,
      a second variable resistance film connected in series to the first variable resistance film, and
      a rectifying element and a variable resistance section including the first variable resistance film and the second variable resistance film,
      the rectifying element and the variable resistance section being connected between the word line and the bit line, and
      the driving voltage of the second variable resistance film being different from the driving voltage of the first variable resistance film,
   wherein in a state in which the second variable resistance film has a low resistance, the first variable resistance film stores information in accordance with a value of a current flowing through the memory cell.

2. The memory according to claim 1, wherein
   the variable resistance section further includes
      a first electrode,
      a second electrode, and
      an intermediate electrode provided between the first electrode and the second electrode,
   the first variable resistance film is provided between the first electrode and the intermediate electrode, and
   the second variable resistance film is provided between the intermediate electrode and the second electrode.

3. The memory according to claim 1, wherein
   the variable resistance section further includes
      a first electrode, and
      a second electrode, and
   the first variable resistance film and the second variable resistance film are provided between the first electrode and the second electrode.

4. The memory according to claim 1, wherein
   in a state in which the second variable resistance film has a high resistance higher than the low resistance the second variable resistance film has in the state in which the second variable resistance film has the low resistance, the memory cell including the first variable resistance film is electrically separated from each of the bit line and the word line.

5. The memory according to claim 1, wherein
   an absolute value of a second reset voltage adapted to provide the second variable resistance film with the state of having the high resistance is higher than an absolute value of a first reset voltage adapted to provide the first variable resistance film with a state having a high resistance.

6. The memory according to claim 1, wherein
   a second set voltage adapted to provide the second variable resistance film with the state of having the low resistance is lower than a first set voltage adapted to provide the first variable resistance film with a state of having a low resistance.

7. The memory according to claim 1, wherein
   the drive circuit section supplies the memory cell with the driving voltage adapted to increase the resistance of the second variable resistance film in a case in which it has been judged that the driving voltage of the first variable resistance film has varied.

8. The memory according to claim 7, wherein
   the drive circuit section provides the second variable resistance film with the state of having the high resistance while keeping the first variable resistance film in the state of having the lower resistance.

9. The memory according to claim 7, wherein
   the variation of the driving voltage of the first variable resistance film is judged in one of an operation of erasing information from the memory cell and an operation of writing information into the memory cell.

10. The memory according to claim 7, wherein
    the variation of the driving voltage of the first variable resistance film is judged based on a result of one of a verifying operation in an operation of erasing information from the memory cell and a verifying operation in an operation of writing information into the memory cell.

11. The memory according to claim 1, wherein
    when increasing a resistance of the second variable resistance film, the drive circuit section set a pulse voltage to be supplied to the memory cell to a voltage higher in absolute value than a maximum voltage to be supplied to the first variable resistance film during storing information.

12. The memory according to claim 1, further comprising:
an address memory section adapted to store an address of the memory cell,
wherein the address memory section stores the address of the memory cell having increased a resistance of the second variable resistance film.

13. The memory according to claim 1, wherein
a variable resistance film not requiring a forming operation is used as the second variable resistance film.

14. A variable resistance memory, comprising:
a memory cell array including memory cells;
a drive circuit section adapted to control a driving voltage to be supplied to the memory cells, and
an address memory section adapted to store an address of the memory cell,
the memory cells each including
a first variable resistance film, and
a second variable resistance film connected in series to the first variable resistance film,
the driving voltage of the second variable resistance film being different from the driving voltage of the first variable resistance film, and
the address memory section storing the address of the memory cell having increased a resistance of the second variable resistance firm.

15. The memory according to claim 14, wherein
in a state in which the second variable resistance film has a low resistance, the first variable resistance film stores information in accordance with a value of a current flowing through the memory cell.

16. The memory according to claim 15, wherein
in a state in which the second variable resistance film has a high resistance higher than the low resistance the second variable resistance film has in the state in which the second variable resistance film has the low resistance, the memory cell including the first variable resistance film is electrically separated from each of the bit line and the word line.

17. The memory according to claim 14, wherein
the drive circuit section supplies the memory cell with the driving voltage adapted to increase the resistance of the second variable resistance film in a case in which it has been judged that the driving voltage of the first variable resistance film has varied.

18. The memory according to claim 17, wherein
the drive circuit section provides the second variable resistance film with the state of having the high resistance while keeping the first variable resistance film in the state of having the lower resistance.

19. A variable resistance memory, comprising:
a memory cell array including memory cells; and
a drive circuit section adapted to control a driving voltage to be supplied to the memory cells,
the memory cells each including
a first variable resistance film, and
a second variable resistance film connected in series to the first variable resistance film, and
the driving voltage of the second variable resistance film being different from the driving voltage of the first variable resistance film,
wherein
in a state in which the second variable resistance film has a low resistance, the first variable resistance film stores information in accordance with a value of a current flowing through the memory cell, and
in a state in which the second variable resistance film has a high resistance higher than the low resistance the second variable resistance film has in the state in which the second variable resistance film has the low resistance, the memory cell including the first variable resistance film is electrically separated from each of a bit line and a word line.

* * * * *